United States Patent [19]
Watanabe et al.

[11] Patent Number: 4,868,464
[45] Date of Patent: Sep. 19, 1989

[54] LINEARITY CORRECTION CIRCUIT FOR TELEVISION RECEIVER

[75] Inventors: Junzo Watanabe; Seiji Kawaberi, both of Kanagawa, Japan

[73] Assignee: Sony Corporation, Tokyo, Japan

[21] Appl. No.: 215,535

[22] Filed: Jul. 6, 1988

[30] Foreign Application Priority Data

Jul. 20, 1987 [JP] Japan ................... 63-179008

[51] Int. Cl.$^4$ ............... H01J 29/56; H01J 29/70
[52] U.S. Cl. .................... 315/371; 315/411
[58] Field of Search ........... 315/370, 371, 408, 411

[56] References Cited

FOREIGN PATENT DOCUMENTS 0122083 7/1984 Japan .................... 315/370
517182 9/1976 U.S.S.R. ................. 315/370

Primary Examiner—Thomas H. Tarcza
Assistant Examiner—Gregory C. Issing
Attorney, Agent, or Firm—Alvin Sinderbrand

[57] ABSTRACT

In a horizontal deflection output circuit adapted for correction of horizontal linearity in a television receiver or the like, and which comprises a switching transistor, a damper diode, a horizontal deflecting coil and an S correcting capacitor connected in series to the horizontal deflecting coil; the terminal voltage of the S correcting capacitor is modulated by a sawtooth signal produced by a linear distortion correcting circuit synchronously with a horizontal periodic signal. The sawtooth signal produced by the switching transistor and fed to the horizontal deflecting coil is applied to the S correcting capacitor which feeds an S correcting current to the horizontal deflecting coil, so as to correct the image distortion caused particularly by the resistance component of the horizontal deflecting coil.

9 Claims, 4 Drawing Sheets

FIG. 3
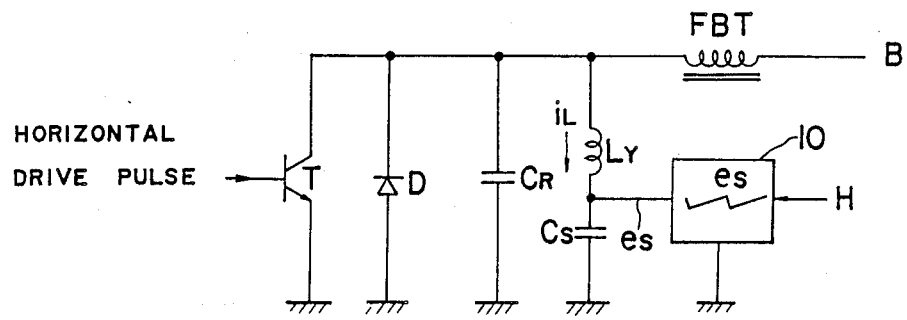
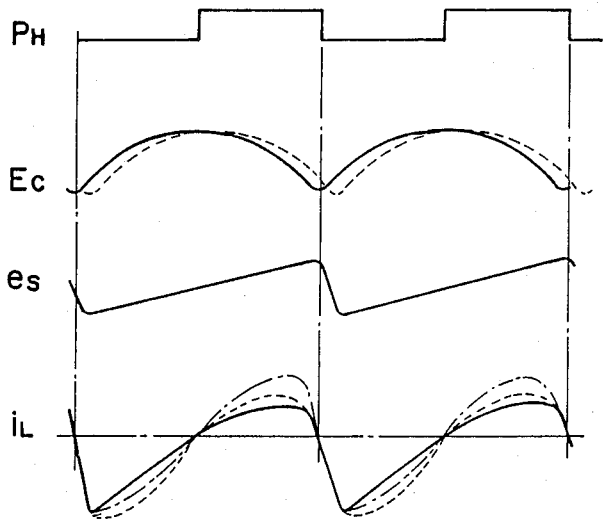
FIG. 4(a) P_H
FIG. 4(b) E_c
FIG. 4(c) e_s
FIG. 4(d) i_L FIG. 5
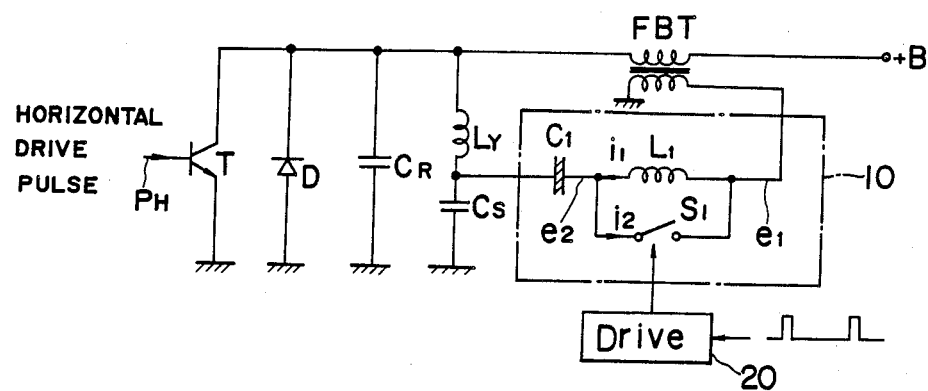
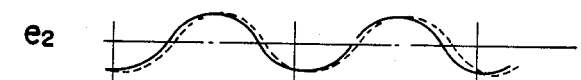
FIG. 6(a)  $e_2$
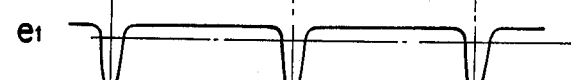
FIG. 6(b)  $e_1$
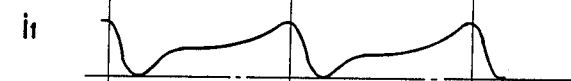
FIG. 6(c)  $i_1$
FIG. 6(d)  $i_2$

LINEARITY CORRECTION CIRCUIT FOR TELEVISION RECEIVER

BACKGROUND OF THE INVENTION

1. Field of the Invention

The present invention relates to a horizontal deflection output circuit for use in a television receiver or the like and, more particularly, is directed to a horizontal output circuit adapted for correction of horizontal linearity.

2. Description of the Prior Art

FIG. 1 shows a conventional horizontal output circuit employed for driving a horizontal deflecting coil in a cathode-ray tube (CRT) of a television receiver, and which includes a switching transistor T turned on and off synchronously with a horizontal periodic signal or drive pulse, a damper diode D, a resonance capacitor $C_R$, a horizontal deflecting coil Ly, an S correcting capacitor $C_S$, and a choke coil FBT normally constituted by a primary winding of a flyback transformer.

As is well known, such horizontal output circuit operates so that, when the switching transistor T is in its on-state, a sawtooth current is allowed to flow in the horizontal deflecting coil Ly. On the other hand, when the switching transistor T is turned off, the electromagnetic energy accumulated in the horizontal deflecting coil Ly is transferred to the resonance capacitor $C_R$ due to the resonance phenomenon arising from such coil in combination with the capacitor $C_R$, and the resultant oscillation serves to invert the current in the horizontal deflecting coil. Then, the inverted current is decreased gradually via the damper diode D while charging the S correcting capacitor $C_S$.

Accordingly, when the switching transistor T is turned on and off synchronously with the horizontal drive pulse, an alternating sawtooth current is made to flow in the horizontal deflecting coil Ly, and the resulting magnetic field causes an electron beam to scan in the horizontal direction in the CRT.

However, in such conventional horizontal output circuit, two factors are usually present which deteriorate the linearity of the horizontal scanning. The first factor is the difference between the center of curvature of the CRT fluorescent screen and the center of deflection of the electron beam, and such difference results in a raster distortion by which the image contracts at the center of the screen and expands at the opposite sides thereof.

The second factor is the deviation of the deflecting current from a straight line due to the series resistance existing in the output circuit (principally, the resistance of the deflecting coil Ly), whereby the deflecting current has a saturation curve with linear distortion such that the image expands at the left side of the screen and contracts at the right side of the screen.

In order to eliminate the raster distortion resulting from the first factor described above, it has been customary heretofore to form the deflecting current, for example, as indicated by the solid line 1 in FIG. 2(a), by utilizing the resonance of the S correcting capacitor so as to contract the image at the left and right hand sides relative to the center of the image. Further, for elimination of the linearity distortion caused by the second factor described above, it has been known to connect a saturable reactor having the inductance characteristic shown in FIG. 2(b) in series with the horizontal deflecting coil Ly so that the deflecting current has an overall characteristic represented by the curve 2, on FIG. 2(a), thereby emphasizing the contraction rate at the left side of the image while reducing the contraction rate at the right side thereof. Thus, the two kinds of horizontal distortion of the image are substantially eliminated by the conventional techniques mentioned above.

However, it is difficult to achieve complete correction of the linearity distortion by the provision of a saturable reactor (HLC), and different types of television receivers may require reactors with different characteristics leading to the further disadvantage of considerable variations due to the temperature characteristics, whereby it is extremely difficult to attain fine linearity correction. Accordingly, particularly with dimensional increases of the television screen, the beam scanning speed is not maintained constant at all horizontal positions across the image. In such case, when a caption is superimposed on the image by a projector so as to run horizontally across the displayed image, there may be a variation in the size of the characters running across the image, leading to difficulty in reading the caption.

OBJECT AND SUMMARY OF THE INVENTION

Accordingly, it is an object of the present invention to provide an improved horizontal output circuit which is capable of enhancing the linearity while eliminating the necessity of providing a saturable reactor.

In a horizontal deflection output circuit according to an aspect of the present invention, and in which a sawtooth signal produced by a switching transistor is fed to a horizontal deflecting coil; the sawtooth signal is applied to an S correcting capacitor which applies an S correction to the horizontal deflecting current, so as to correct the image distortion caused particularly by the resistance component of the horizontal deflecting coil, and the terminal voltage of the S correcting capacitor is modulated by a sawtooth signal provided from a linear distortion correcting circuit synchronously with a horizontal periodic signal.

BRIEF DESCRIPTION OF THE DRAWINGS

FIG. 3 is a schematic diagram similar to that of FIG. 1, but generally illustrating the concept embodying the present invention;

FIGS. 4(a) to 4(d) are timing charts showing signal waveforms at various points in the circuit of FIG. 3, and to which reference will be made in explaining the operation of such circuit;

FIG. 5 is a circuit diagram similar to that of FIG. 3, but showing an example of a specific linear distortion correcting circuit that may be used in the horizontal deflection output circuit in accordance with an embodiment of the invention;

FIGS. 6(a) to 6(d) are timing charts showing signal waveforms at various points in the circuit of FIG. 5, and to which reference will be made in explaining the operation of such circuit;

DETAILED DESCRIPTION OF THE PREFERRED EMBODIMENTS

Figure 1:
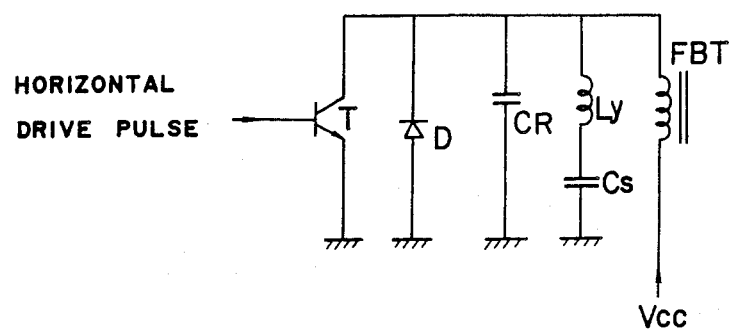
FIG. 1 is a schematic diagram illustrating a horizontal deflection output circuit according to the prior art.
Figure 2A:
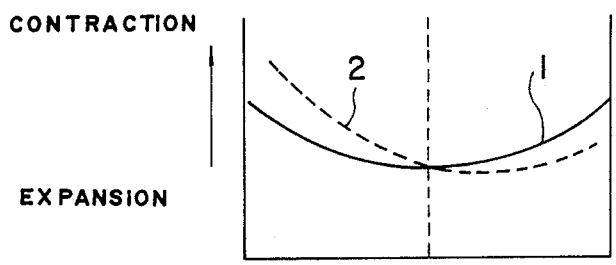
FIGS. 2(a) and 2(b) are graphs to which reference will be made in explaining the operation of the prior art circuit of FIG. 1.
Figure 2B:
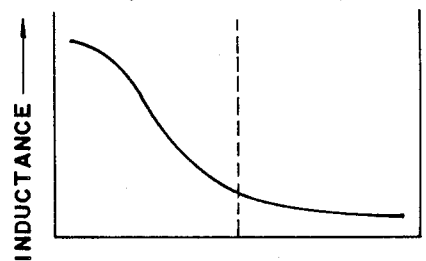

Referring now to FIG. 3 of the drawings, it will be seen that, in accordance with the general concept of the present invention, a conventional horizontal deflection output circuit of the type previously described with reference to FIG. 1 and similarly having a switching transistor T, a damper diode D, a resonance capacitor $C_R$, a horizontal deflecting coil $L_y$, an S correcting capacitor $C_S$ and a primary coil FBT of a flyback transformer, is further provided with a linearity distortion correcting circuit 10 which feeds a smooth sawtooth signal of the horizontal period to the S correcting capacitor $C_S$.

When the switching transistor T is turned on and off by drive pulses $P_H$ [FIG. 4(a)], a deflecting current $i_L$ is made to flow in the deflecting coil $L_y$ as indicated by the solid line in FIG. 4(d) so that the terminal voltage $E_C$ of the S correcting capacitor $C_S$ which is charged and discharged by such deflecting current $i_L$ has the parabolic waveform shown in FIG. 4(b). Accordingly, the current $i_L$ flowing in the deflecting coil $L_y$ becomes the dotted-line sawtooth wave shown on FIG. 4(d) which contracts at both a trace start point (left side of image) and a trace end point (right side of image), thereby correcting the raster distortion.

However, there still remains the contraction in the right-hand image portion relative to the expansion in the left-hand image portion which results from the linearity distortion due to the aforementioned resistive component of the deflecting coil. In accordance with the present invention, a sawtooth correction signal $e_s$ [FIG. 4(c)] is fed from the linearity distortion correcting circuit 10 to the S correcting capacitor $C_S$ at a junction point between the latter and the deflection coil $L_y$. As a result of the foregoing, the terminal voltage $E_C$ of the S correcting capacitor $C_S$ is modified, as represented by the dotted line on FIG. 4(b), so that the deflecting current $i_L$ is being fed from the S correcting capacitor $C_S$ is also modified to have the waveform represented by the one-dot chain line on FIG. 4(d), and in which the gradient is emphasized at the trace end point (right-hand image portion), whereby the right-hand image portion is expanded relative to the left-hand image portion.

As a result of the above operation, the linearity distortion caused by saturation is corrected simultaneously with correction of the raster distortion.

Referring now to FIG. 5, it will be seen that a horizontal deflection output circuit according to the embodiment of this invention there shown is generally similar to that described above with reference to FIG. 3, with the elements of the circuit shown in FIG. 5 which correspond to those described with reference to FIG. 3 being identified by the same reference symbols and numerals. However, in the specific embodiment of the invention illustrated by FIG. 5, the linearity distortion correcting circuit 10 is shown to comprise a direct-current blocking capacitor $C_1$, a choke coil $L_1$ and a switch $S_1$. The capacitor $C_1$ and choke coil $L_1$ are connected in series with a secondary winding of the flyback transformer FBT to a junction point between the deflecting coil $L_y$ and the S correcting capacitor $C_S$. The switch $S_1$ is connected in parallel with the choke coil $L_1$ and is controlled by a drive circuit 20 so as to be turned on or closed only during a flyback or retrace interval of each horizontal period.

In the operation of the horizontal deflection output circuit shown on FIG. 5, a flyback pulse $e_1$ [FIG. 6(b)] of a predetermined negative level is supplied from the secondary winding of the flyback transformer FBT to the linearity distortion correcting circuit 10. As the switching transistor T is turned on and off in response to horizontal drive pulses $P_H$ [FIG. 4(a)] applied to its base electrode, a sawtooth current is made to flow through the horizontal deflecting coil $L_y$, so that the terminal voltage of the S correcting capacitor $C_S$ is varied, as indicated at $e_2$ in FIG. 6(a). The negative flyback pulse $e_1$ generated during the retrace interval, as shown in FIG. 6(b), is fed through the switch $S_1$ which, as earlier noted, is controlled by the drive circuit 20 so as to be turned on or closed only during such retrace or flyback interval. Closing of the switch $S_1$ causing discharging of the S correcting capacitor $C_S$ by means of the discharge current $i_2$ flowing through the switch $S_1$, and which serves to lower the terminal voltage of the S correcting capacitor $C_S$. Since the switch $S_1$ is controlled by the drive circuit 20 so as to be turned off or open during the trace interval, that is, between successive flyback intervals, the S correcting capacitor $C_S$ is gradually charged by the charge current $i_1$ [FIG. 6(c)] passing through the choke coil $L_1$.

As a result of the foregoing, the terminal voltage $e_2$ [FIG. 6(a)] of the S correcting capacitor $C_S$ is modulated or modified as indicated by the dotted line and, therefore, the current fed from the S correcting capacitor $C_S$ to the horizontal deflecting coil $L_y$ is adapted or varied for correcting the linearity distortion simultaneously with the correction of the raster distortion.

The waveforms of the correcting charge and discharge currents $i_1$ and $i_2$ [FIGS. 6(c) and 6(d)] can be changed by adjusting the peak value of the negative flyback pulse $e_1$ or the inductance of the choke coil $L_1$. Therefore, the desired correction can be easily and accurately attained for improving the linearity of television receivers that may have different deflection characteristics.

Figure 7:
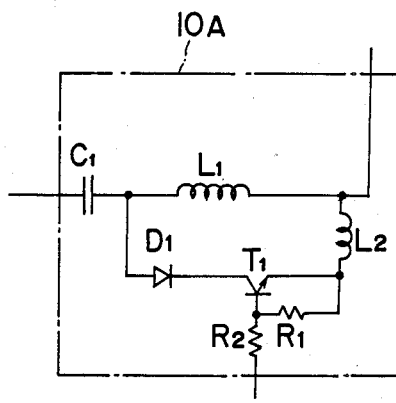
FIG. 7 is a circuit diagram showing a specific linear distortion correcting circuit that may be used in the horizontal deflection output circuit according to another embodiment of the invention.

Referring now to FIG. 7, it will be seen that, in accordance with another embodiment of this invention, the linearity distortion correcting circuit 10 of FIG. 5 may be replaced by a similarly functioning linearity distortion correcting circuit 10A in which a switching transistor $T_1$ is used in place of the switch $S_1$ of the earlier described embodiment. More specifically, the switching transistor $T_1$ has its collector-emitter path connected in series with an inverse-current preventing diode $D_1$ and a current limiting coil $L_2$ in a circuit that is in parallel with the choke coil $L_1$. Further, base voltage setting resistors $R_1$ and $R_2$ are suitable connected with the transistor $T_1$. By way of example, the base voltage setting resistors $R_1$ and $R_2$ may have resistance values of 470Ω and 47Ω, respectively, while the current limiting coil $L_2$ has an inductance value of 470 μH.

Figure 8:
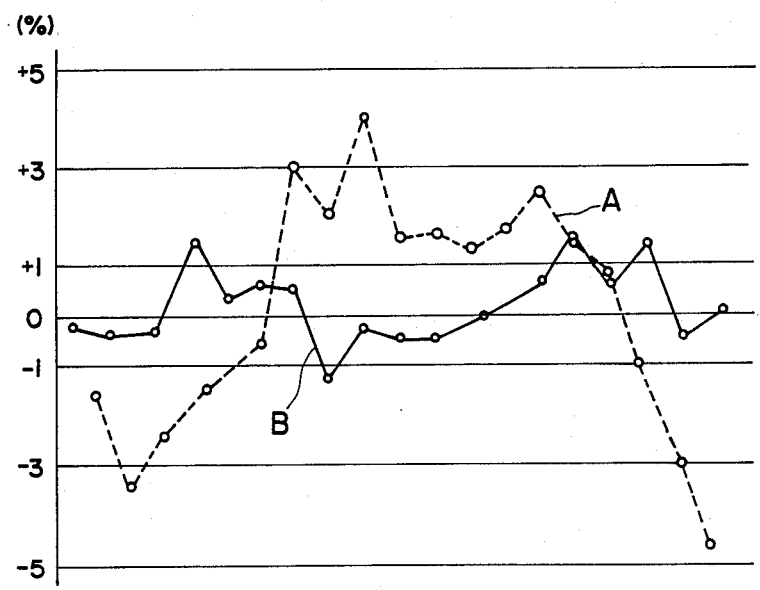
FIG. 8 is a graph comparing horizontal distortion rates obtained when using a saturable reactor according to the Prior Art, and when using a horizontal linearity correction circuit according to this invention.

Horizontal distortion rates have actually been measured for a television receiver provided with a conventional horizontal output circuit having a saturable reactor for correction of linearity distortion, and for a television receiver provided with a linearity distortion correcting circuit according to this invention, for example, as in FIG. 7. The data obtained by such measurements of the horizontal distortion rates are graphically shown on FIG. 8 in which the horizontal image positions are indicated along the abscissa and the distortion rates are indicated along the ordinate. Further, on FIG. 8, the dotted line A represents the distortion rates obtained at various horizontal image positions in the case of the television receiver according to the prior art which uses a conventional saturable reactor for correction of linearity distortion. On the other hand, the solid line B indicates the distortion rates at different horizontal image positions for the television receiver provided with the linearity distortion correction circuit embodying the present invention. It will be seen that, in the case of the prior art (the line A) distortion rates as high as ±3.5% is obtained, where-as, in the case of the television receiver provided with a linearity distortion correcting circuit according to this invention, the maximum distortion rates were reduced to no more than ±1.5%. Such improvement in linearity is particularly conspicuous to a viewer of a large-screen television receiver.

In the case of the linear distortion correcting circuit 10A shown on FIG. 7, a transistor $T_1$ is employed to act as a switching element. However, it will be understood that such switching function could be performed by the diode $D_1$ alone.

By way of summary, it will be appreciated that a horizontal deflection output circuit according to the present invention includes a linearity distortion correcting circuit by which a correcting current is fed to the S correcting capacitor to modulate or modify the amplitude of the terminal voltage of the latter, whereby the characteristic deterioration and variation resulting from temperature fluctuations can be reduced, as compared with the linearity correction effected in accordance with the prior art by the use of a saturable reactor. Further, through the use of the present invention, as described above, the correction characteristic can be accurately varied so as to achieve remarkable minimizing of the distortion rates.

Although illustrative embodiments of this invention have been described in detail herein with reference to the accompanying drawings, it is to be understood that the invention is not limited to those precise embodiments, and that various changes and modifications may be affected therein by one skilled in the art without departing from the scope or spirit of the invention as defined in the appended claims.

What is claimed is:

1. A horizontal deflection output circuit comprising a switching transistor, a damper diode, a horizontal deflecting coil, an S correcting capacitor connected in series to said horizontal deflecting coil, and linear distortion correcting means receiving a horizontal periodic signal and providing a sawtooth output signal synchronously with said horizontal periodic signal which modulates a terminal voltage of said S correcting capacitor, and which peaks at the end of each horizontal period of said horizontal periodic signal.

2. A horizontal deflection output circuit according to claim 1, wherein said linear distortion correcting means includes an integrating coil receiving flyback pulses for integrating the latter, a direct-current blocking capacitor connected in series to said integrating coil and to a junction point between said horizontal deflecting coil and said S correcting capacitor, switching means connected in parallel with said integrating coil, and means for turning on said switching means during a retrace interval.

3. A horizontal deflection output circuit according to claim 2; wherein said linear distortion correcting means further includes a current-limiting coil connected in series to said switching means.

4. A horizontal deflection output circuit according to claim 3; wherein said switching means includes a second switching transistor.

5. A horizontal deflection output circuit according to claim 4; wherein said switching means further includes an inverse-current preventing diode.

6. A horizontal deflection output circuit according to claim 3; wherein said switching means includes a diode which is conductive during said retrace interval.

7. A horizontal deflection output circuit according to claim 2; wherein said switching means includes a second switching transistor.

8. A horizontal deflection output circuit according to claim 7; wherein said switching means further includes an inverse-current preventing diode.

9. A horizontal deflection output circuit according to claim 2; wherein said switching means includes a diode which is conductive during said retrace interval.

* * * * *